United States Patent
Park

(10) Patent No.: US 8,665,649 B2
(45) Date of Patent: Mar. 4, 2014

(54) NON-VOLATILE MEMORY DEVICE AND ISPP PROGRAMMING METHOD

(71) Applicant: Samsung Electronics Co., Ltd., Suwon-si (KR)

(72) Inventor: Ki Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/835,409

(22) Filed: Mar. 15, 2013

(65) Prior Publication Data

US 2013/0208543 A1 Aug. 15, 2013

Related U.S. Application Data

(62) Division of application No. 12/690,995, filed on Jan. 21, 2010, now abandoned.

(30) Foreign Application Priority Data

Jan. 30, 2009 (KR) ........................ 10-2009-0007716

(51) Int. Cl.
*G11C 16/04* (2006.01)

(52) U.S. Cl.
USPC ................................ 365/185.19; 365/185.22

(58) Field of Classification Search
USPC ............................ 365/185.19, 185.22, 185.02
See application file for complete search history.

(56) References Cited

U.S. PATENT DOCUMENTS

| | | | |
|---|---|---|---|
| 5,774,397 A | 6/1998 | Endoh et al. | |
| 6,396,738 B1 * | 5/2002 | Tamada et al. | 365/185.19 |
| 6,490,201 B2 * | 12/2002 | Sakamoto | 365/185.22 |
| 6,768,682 B2 | 7/2004 | Yano et al. | |
| 6,862,217 B2 * | 3/2005 | Kawabata | 365/185.18 |
| 6,882,567 B1 * | 4/2005 | Wong | 365/185.03 |
| 7,596,031 B2 * | 9/2009 | Hemink et al. | 365/185.19 |
| 7,599,219 B2 | 10/2009 | Kim et al. | |
| 7,656,710 B1 * | 2/2010 | Wong | 365/185.19 |
| 2008/0101126 A1 | 5/2008 | Hemink et al. | |
| 2008/0316832 A1 | 12/2008 | Fong et al. | |
| 2009/0238006 A1 | 9/2009 | Nobungaga | |

FOREIGN PATENT DOCUMENTS

KR    1020080029561 A    4/2008

\* cited by examiner

*Primary Examiner* — Douglas King

(74) *Attorney, Agent, or Firm* — Volentine & Whitt, PLLC

(57) ABSTRACT

A method programming a non-volatile memory device using an incremental step pulse programming (ISPP) scheme is disclosed. The method includes operating in a first program mode during which a program pulse width is constant and a program voltage is successively increased per ISPP cycle, and during which a program operation and a verify operation are alternately repeated, and operating in a second program mode during which the program pulse width is successively increased per ISPP cycle and the program voltage is constant, and during which the program operation and the verify operation are alternately repeated, wherein operation in the second program mode follows operation in the first program mode only when the program voltage equals a maximum value, or when a verification result count value satisfies a predetermined condition.

6 Claims, 16 Drawing Sheets

(A)

(B)

NON-VOLATILE MEMORY DEVICE AND ISPP PROGRAMMING METHOD

CROSS-REFERENCE TO RELATED APPLICATIONS

This is a Divisional of U.S. non-provisional application Ser. No. 12/690,995, filed Jan. 21, 2010, which claims priority under 35 U.S.C. §119 to Korean Patent Application No. 10-2009-0007716 filed on Jan. 30, 2009, the subject matter of which is hereby incorporated by reference.

BACKGROUND

The present inventive concept relates to semiconductor memory devices and more particularly to non-volatile memory devices programmed using an incremental step pulse programming (ISPP) scheme. The inventive concept as relates to methods for programming non-volatile memory devices.

Semiconductor memory devices include volatile and non-volatile types of memory. Volatile memories general enjoy fast read/write speeds, but lose stored data in the absence of applied power. In contrast, non-volatile memories generally operate at slower read/write speeds, but retained stored data in the absence of applied power. Due to this ability to retain stored data in the absence of applied power, non-volatile memory has been increasingly used in a variety of host devices to store programming (or system) data as well as payload (or user) data.

Nonvolatile memory includes a variety of memory types including phase-change random access memory (PRAM), mask read-only memory (MROM), programmable read-only memory (PROM), erasable programmable read-only memory (EPROM), and electrically erasable programmable read-only memory (EEPROM). However, MROM, PROM, and EPROM types of nonvolatile memory do not provide ready access to data since read/write operations are slow and cumbersome. On the other hand, EEPROM enables electrical erase and write operations and is thus increasingly used in applications which require continuous data update or the use of auxiliary memory devices.

Among other types of EEPROM, so-called flash EEPROM or "flash memory" is capable of being fabricated with a very high degree of memory cell integration. Thus, flash memory is commonly used to implement large-capacity auxiliary memory devices, and has been increasingly incorporated into electronic devices, such as digital cameras, digital camcorders, digital music players, mobile telephones, etc. These host devices require large data storage capacity and high performance re-programmability, but must also be manufactured with a compact size. Flash memory generally includes NAND-type and NOR-type flash memory.

The data stored in a memory cell of flash memory, including both single level and multi-level memory cells, is defined by a corresponding threshold voltage of the memory cell. A program operation defines this threshold voltage. In many conventional program operations, the threshold voltage of a memory cell is incrementally defined using an ISPP scheme.

Generally speaking, when a memory cell is programmed using an ISPP scheme, a program voltage applied to a word line connected to the memory cell is gradually increased through a sequence of step increments until the program voltage reaches a level sufficient to properly program the target memory cell. Since the voltage program is a relatively high voltage, it may cause the conventionally understood "program disturb" in memory cells adjacent to the target memory cell. The program disturb is essentially a phenomenon in which the threshold voltage(s) of one or more memory cell(s) nearby the target memory cell is undesirably modified by the program voltage being applied to the target memory cell. As will be appreciated, when the program voltage is step-increased through an ISSP scheme, the risk of a program disturb occurring increases. Therefore, a programming method capable of reducing the risk of program disturbs is desired.

SUMMARY

Embodiments of the inventive concept provide a programming method capable of reducing the risk of program disturbs in memory cells of a non-volatile memory device.

According to certain embodiments of the inventive concept, there is provided a method of programming a non-volatile memory device including a plurality of non-volatile memory cells using an incremental step pulse programming (ISPP) scheme, the method comprising; operating in a first program mode during which a program pulse width is constant and a program voltage is successively increased per ISPP cycle, and during which a program operation and a verify operation are alternately repeated, and operating in a second program mode during which the program pulse width is successively increased per ISPP cycle and the program voltage is constant, and during which the program operation and the verify operation are alternately repeated, wherein operation in the second program mode follows operation in the first program mode only when the program voltage equals a maximum value, or when a verification result count value satisfies a predetermined condition.

According to certain other embodiments of the inventive concept, there is provided a method of programming a non-volatile memory device including a plurality of non-volatile memory cells using an incremental step pulse programming (ISPP) scheme, the method comprising; operating in a first program mode during which a program pulse width is constant and a program voltage is successively increased by a first step voltage per ISPP cycle, and during which a program operation and a verify operation are alternately repeated, and operating in a second program mode during which the program pulse width is successively increased per ISPP cycle and the program voltage is increased by a second step voltage, and during which a program operation and a verify operation are alternately repeated, wherein operation in the second program mode follows operation in the first program mode only when the program voltage equals a maximum value, or a verification result count value satisfies a predetermined condition.

According to certain other embodiments of the inventive concept, there is provided a method of programming a non-volatile memory device including a plurality of non-volatile memory cells using an incremental step pulse programming (ISPP) scheme, the method comprising; operating in a first program mode during which a program operation and a verify operation are alternately repeated and during which; (a) a program pulse width is constant, (b) a program voltage is successively increased per ISPP cycle, and (c) a bit line program inhibition voltage applied to a bit line connected to a program-inhibited cell and a bit line program voltage applied to a bit line connected to a program cell are constant, and operating in a second program mode during which; (a) the program pulse width is constant, (b) the program voltage is constant at a maximum valve, and (c) the bit line program inhibition voltage applied to the bit line connected to the program-inhibited cell is constant and the bit line program voltage applied to the bit line connected to the program cell successively decreases per ISPP cycle, wherein operation in the second program mode follows operation in the first program mode only when the program voltage equals a maximum value, or when a verification result count value satisfies a predetermined condition.

According to certain embodiments of the inventive concept, there is provided a method of programming a non-volatile memory cell capable of storing multilevel data in accordance with multiple program states including a low program state and a high program state using an incremental step pulse programming (ISPP) scheme, the method comprising; performing low-state programming in which a series of low-state program pulses, for which a pulse width is maintained constant and a program voltage is successively increased per ISPP cycle, are applied to program the non-volatile memory cell in the low program state, wherein the low-state programming comprises performing a program operation followed by a verify operation per ISPP cycle, and performing high-state programming in which a series of high-state program pulses, for which the pulse width is successively increased per ISPP cycle and the program voltage is maintained constant, are applied to program the non-volatile memory cell in the high program state, wherein the high-state programming comprises performing the program operation followed by the verify operation per ISPP cycle, wherein the low-state programming and the high-state programming are performed in parallel by applying one of the low-state program pulses and one of the high-state program pulses between adjacent verify pulses.

BRIEF DESCRIPTION OF THE DRAWINGS

The above and other features and advantages of the inventive concept will become more apparent by describing in detail embodiments thereof with reference to the attached drawings in which.

DETAILED DESCRIPTION OF EMBODIMENTS

The inventive concept now will be described more fully hereinafter with reference to the accompanying drawings in which embodiments of the inventive concept are shown. This inventive concept may, however, be embodied in many different forms and should not be construed as being limited to only the illustrated embodiments. Rather, these embodiments are presented as teaching examples. Throughout the written description and drawings, like reference numbers and labels are used to indicate like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
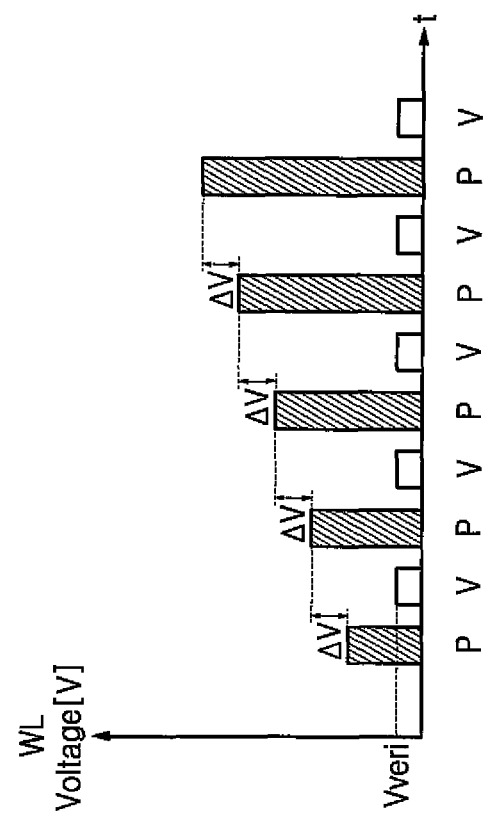
FIG. 1 is a diagram showing program pulses and verify pulses which are applied to a word line of a memory cell in a conventional flash memory using an incremental step pulse programming (ISPP) scheme.

FIG. 1 is a diagram showing program pulses (P) and verify pulses (V), applied to a word line of a memory cell in a conventional flash memory using an incremental step pulse programming (ISPP) scheme. Referring to FIG. 1, during a conventional ISPP cycle, the incremental step of a program voltage is fixed to ΔV and a program pulse time is also fixed. The verify pulse (V) is used to verify whether the target memory cell has been properly programmed (i.e., has "passed" programming, or is a "pass cell") by the applied program pulses (P).

During a verify operation, a verify voltage (Vveri) is applied to the target word line (i.e., the word line connected to the target memory cell being programmed) to verify whether the target memory cell receiving a previously applied programming pulse is now a pass cell. As described above, when a memory cell is programmed using the ISPP scheme, the program voltage applied to the target word line is increased through a sequence of steps until programming is completed (i.e., a pass cell state is obtained). Unfortunately, as previously noted, such high-voltage program voltage causes program disturbs among neighboring memory cells (i.e., memory cells located near-by the target memory cell).

Figure 2:
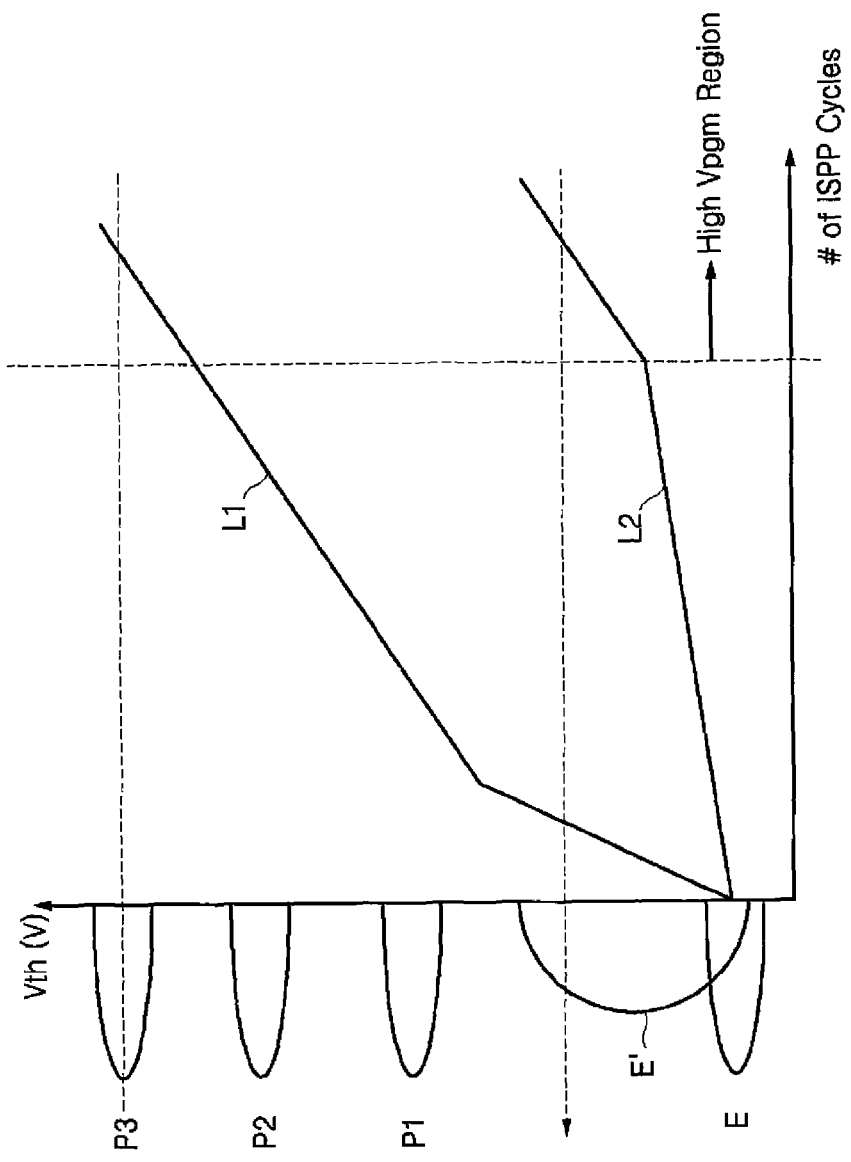
FIGS. 2 and 3 are diagrams showing an example of a program disturb caused by programming of a neighboring cell.
Figure 3:
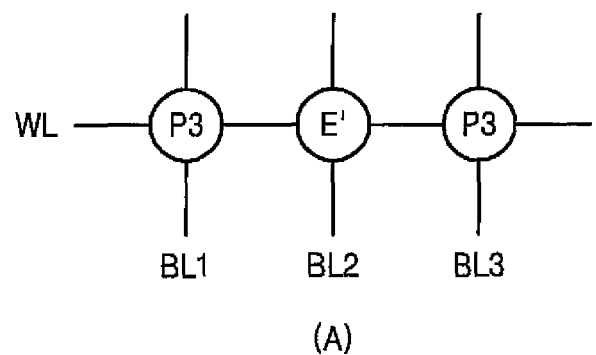
Figure 3:
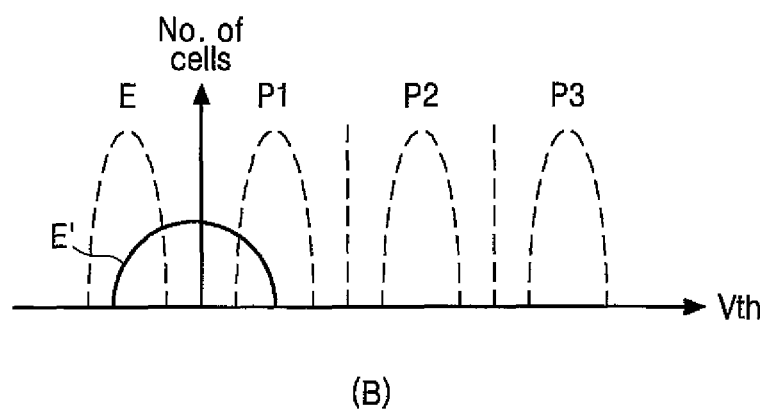

FIG. 2 and FIG. 3, inclusive of FIGS. 3A and 3B, are diagrams conceptually illustrating the development of a program disturb. Referring to FIGS. 2 and 3, it is assumed that a first memory cell is located at the intersection of a word line WL and a bit line BL2 and is programmed in an erased state E. Further, it is assumed that second and third memory cells are respectively located at intersections between the same word line WL and adjacent bit lines BL1 and BL3. As illustrated in FIG. 2, when the second and third memory cells are programmed to a third programmed state P3, the threshold voltage (Vth) distribution of the first memory cell (i.e., now acting as a neighboring memory cell in relation to the programming of either the second or third memory cells) is disturbed and changes from its intended erased state E to a disturbed state E'. In other words, the threshold voltage distribution undesirably broadens from E to E' due to the program disturb.

Such program disturb may be caused by bit line to bit line charge coupling or channel coupling. As an applied program voltage Vpgm increases, the likelihood of a program disturb occurring increases. For example, when a memory cell is programmed to a first or second programmed state P1 or P2, program disturb of a neighboring memory cell in the erased state E is mostly caused by bit line to bit line charge coupling. However, when a memory cell is programmed from the second programmed state P2 to the third programmed state P3, program disturb is mostly caused by channel coupling because of the program voltage Vpgm is relatively high.

As illustrated in FIG. 2, as the number of applied ISPP cycles increases, the program voltage Vpgm increases in steps and a threshold voltage Vth of a memory cell programmed to the third programmed state P3 changes as shown by the graph line L1. At this time, the threshold voltage Vth of a neighboring cell in the erased state E changes, as shown by the graph line L2, in which the slope of the threshold voltage Vth rapidly increases in a high program voltage region where the program voltage Vpgm is higher than a predetermined value. Accordingly, it may be inferred that program disturb is primarily caused by the high program voltage. Therefore, an approach for reducing program disturb caused by programming of neighboring cells is desired. In particular, an approach for reducing program disturb caused by a high program voltage is earnestly desired.

Figure 4:
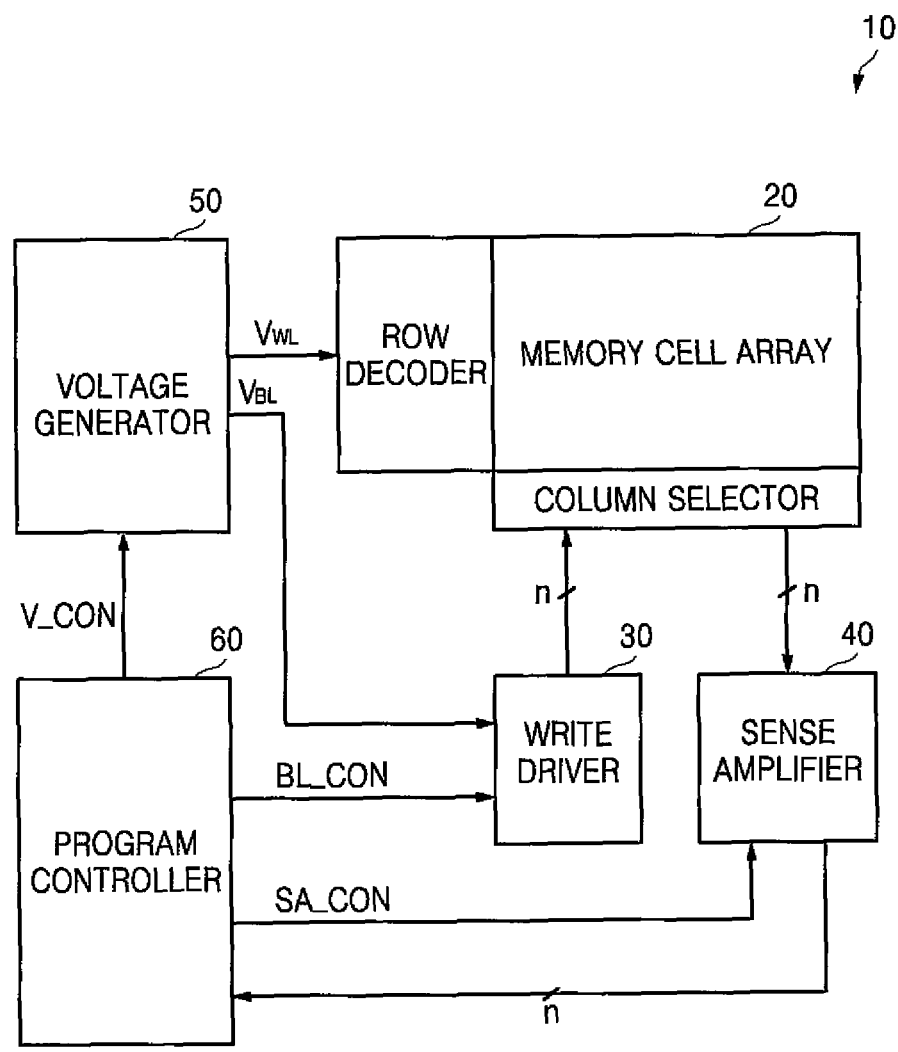
FIG. 4 is a block diagram of a non-volatile memory device according to certain embodiments of the inventive concept.

FIG. 4 is a block diagram of a non-volatile memory device 10 according to certain embodiments of the inventive concept. Referring to FIG. 4, the non-volatile memory device 10 comprises a memory cell array 20, a write driver 30, a sense amplifier 40, a voltage generator 50, and a program controller 60. Although not illustrated in FIG. 4, the non-volatile memory device 10 may also comprise circuit components such as an interface unit connecting a memory controller or a host, an error detection/correction code (ECC) unit, etc.

The memory cell array 20 includes a plurality of non-volatile memory cells (not shown) connected to word lines and bit lines and a row decoder and a column selector which operate to select memory cells. The non-volatile memory cells may be NOR-type cells or NAND-type cells.

The voltage generator 50 generates a word line voltage $V_{WL}$ and a bit line voltage $V_{BL}$, which are necessary for a program or verify operation, and provides them to a word line in the memory cell array 20 and the write driver 30, respectively. The word line voltage $V_{WL}$ provided to the word line includes a program voltage provided when a cell is programmed and a verify voltage provided during the verify operation. A voltage used to program a memory device varies with a programming cycle according to a predetermined rule or is applied to a word line in the form of a pulse with a predetermined voltage level and pulse width in order to shift the threshold voltage of a memory cell above the verify voltage. In addition, the bit line voltage $V_{BL}$ applied to a bit line during the program operation is provided in synchronization with the program voltage. The bit line voltage $V_{BL}$ includes a program voltage applied to a bit line connected to a cell to be programmed (hereinafter, referred to as "program cell") and a program inhibition voltage applied to a bit line connected to a cell not to be programmed (hereinafter, referred to as "program-inhibited cell").

The write driver 30 sets a bit line voltage for program cells in the program operation. In detail, the write driver 30 activates a bit line connected to a selected memory cell at the moment when a program pulse is applied to a word line connected to the memory cell. For instance, the write driver 30 may apply the bit line voltage $V_{BL}$ provided from the voltage generator 50 to a bit line connected to a selected cell in response to a bit line control signal BL_CON received from the program controller 60.

The sense amplifier 40 is connected in parallel with the write driver 30 and bit lines and senses cell data by sensing a cell state in a read operation and a verify operation. In the read operation, a read voltage is applied to a word line and the sense amplifier 40 senses data stored in a cell according to whether the cell is a pass cell. In the verify operation performed during a verify period in the ISPP scheme, the verify voltage is applied to the word line.

The program controller 60 controls the program operation and the verify operation of the memory device 10. The program controller 60 controls the internal members, e.g., the write driver 30, the sense amplifier 40, and the voltage generator 50, of the memory device 10 to execute a programming method according to some embodiments of the present inventive concept. The program controller 60 may control such that a program mode is divided into a first program mode and a second program mode. In the first program mode, the width of a program pulse is fixed and a program voltage is increased by a step voltage. In the second program mode, the width of the program pulse is increased based on the number of programming cycles and the program voltage is fixed or increased. The program controller 60 may control such that low-state programming and high-state programming are performed in parallel. This will be described with reference to FIGS. 5 through 11 hereafter. In addition, the program controller 60 may receive data indicating the pass state or fail state of a cell from the sense amplifier 40 and count pass cells or fail cells during the verify operation.

Figure 5:
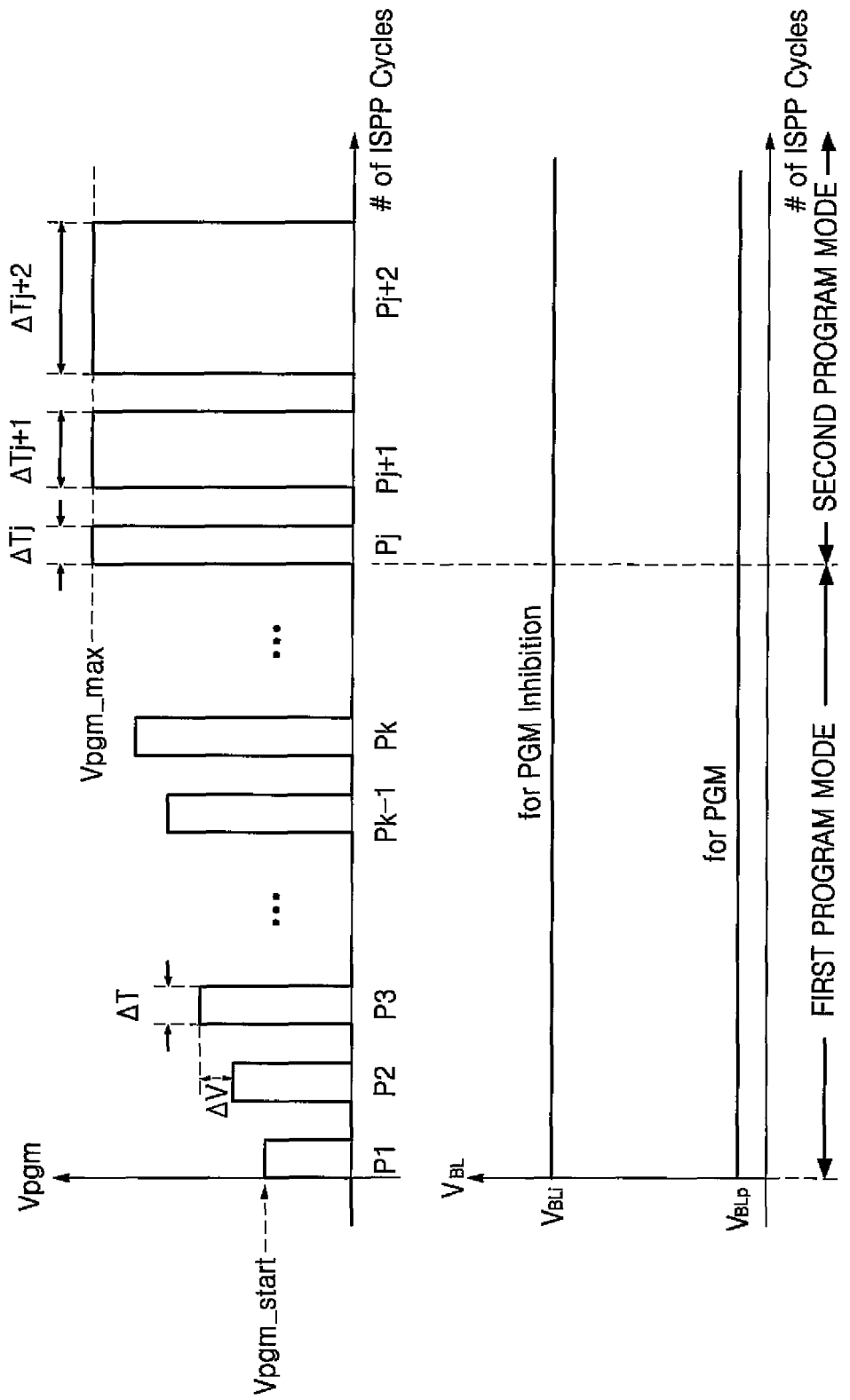
FIG. 5 is a diagram showing a programming method according to certain embodiments of the inventive concept.

FIG. 5 is a diagram illustrating a programming method according to certain embodiments of the inventive concept. The overall programming method illustrated in FIG. 5 is conceptually divided into a first program mode and a following second program mode.

During the first program mode, the pulse width ΔT of a program voltage Vpgm, (i.e., the period of time during which the program voltage Vpgm is applied and hereinafter alternately referred to as "program voltage application time ΔT") is maintained constant and the program voltage Vpgm is increased from a program start voltage Vpgm_start by a step voltage ΔV so that programming is performed using the ISPP scheme. When the increased program voltage Vpgm reaches a predetermined maximum value Vpgm_max or when a verification result count value satisfies a predetermined condition, the second program mode starts. The verification result count value is a result value obtained through a verify operation, and may take a number of different forms. For example, the verification result count value may be defined as a number of pass cells having passed verification or a number of fail cells having failed verification.

When the program voltage Vpgm reaches the predetermined maximum value Vpgm_max or the number of pass cells or fail cells reaches a predetermined value, the program controller 60 provides appropriate control signals to cause the non-volatile memory to enter the second program mode. For instance, it is assumed that 1 Kbyte of memory cells among a program page of 2 Kbytes are to be programmed. At this time, the program controller 60 is assumed to be running the non-volatile memory in the first program mode when a number of fail cells obtained as a verification result is greater than a predetermined value, (e.g., 10 bits). Thereafter, the controller 60 causes entry into the second program mode since the number of fail cells is greater than the predetermined value.

During the second program mode, the program voltage Vpgm is maintained at the maximum value Vpgm_max, but the pulse width of the program voltage Vpgm is incrementally increased. For example, in one embodiment of the inventive concept, the pulse width of the program voltage Vpgm may be doubled during each subsequent ISPP cycle during the second program mode. That is, for a first program pulse Pj in the second program mode, the program voltage Vpgm may be set to the maximum value Vpgm_max and a pulse width $\Delta Tj$ of 10 μs. For a second program pulse Pj+1, the program voltage Vpgm remains at the maximum value Vpgm_max, but the pulse width $\Delta Tj+1$ is set to 20 μs (or double the previous pulse width $\Delta Tj$). For a third program pulse Pj+2, the program voltage Vpgm remains at the maximum value Vpgm_max, but the pulse width $\Delta Tj+2$ is set to 40 μs (again double the previous pulse width $\Delta Tj+1$).

During the first and second program modes, a bit line program voltage $V_{BLp}$ (e.g., 0 V) is applied to a bit line connected to a program cell and a bit line program inhibition voltage $V_{BLi}$ (e.g., 2.5 V) is applied to a bit line connected to a program-inhibited cell. Although not shown in FIG. 5, a verify pulse with a defined verify voltage and width may be applied between two adjacent program pulses, as illustrated in FIG. 1.

In the embodiment of the inventive concept illustrated in FIG. 5, when the program voltage Vpgm reaches a predetermined voltage (i.e., Vpgm_max) or when the verification result count value satisfies a predetermined count condition (i.e., when the second program mode is indicated), the program voltage Vpgm of a program pulse is maintained constant but the width of the program pulse is increased.

As alternately described, low-state programming is performed during the first program mode and high-state programming is performed during the second program mode. The low-state programming is characterized within an overall ISPP scheme by a program voltage Vpgm having a program pulse that is increased by the step voltage ΔV and the pulse width that is maintained constant. In contrast, the high-state programming is characterized by a constant (e.g., a defined maximum) program voltage Vpgm level and a pulse width that is increased during each successive ISSP cycle. Within certain embodiments of the inventive concept, the term "low state" denotes a lower programmed state (e.g., P1 or P2 illustrated in FIG. 2 or 8A) in which a memory cell has a relatively low threshold voltage and the term "high state" denotes a programmed state (e.g., P3 illustrated in FIG. 2 or 8A) in which a memory cell has a relatively high threshold voltage. Accordingly, the low-state programming may be effectively used to program a memory cell to a low state P1 or P2, while the high-state programming may be used to program a memory cell to the high state P3.

Alternately considered, the low-state programming may be performed using a conventional ISPP scheme and the high-state programming may be performed using a programming method according to an embodiment of the inventive concept.

Figure 6:
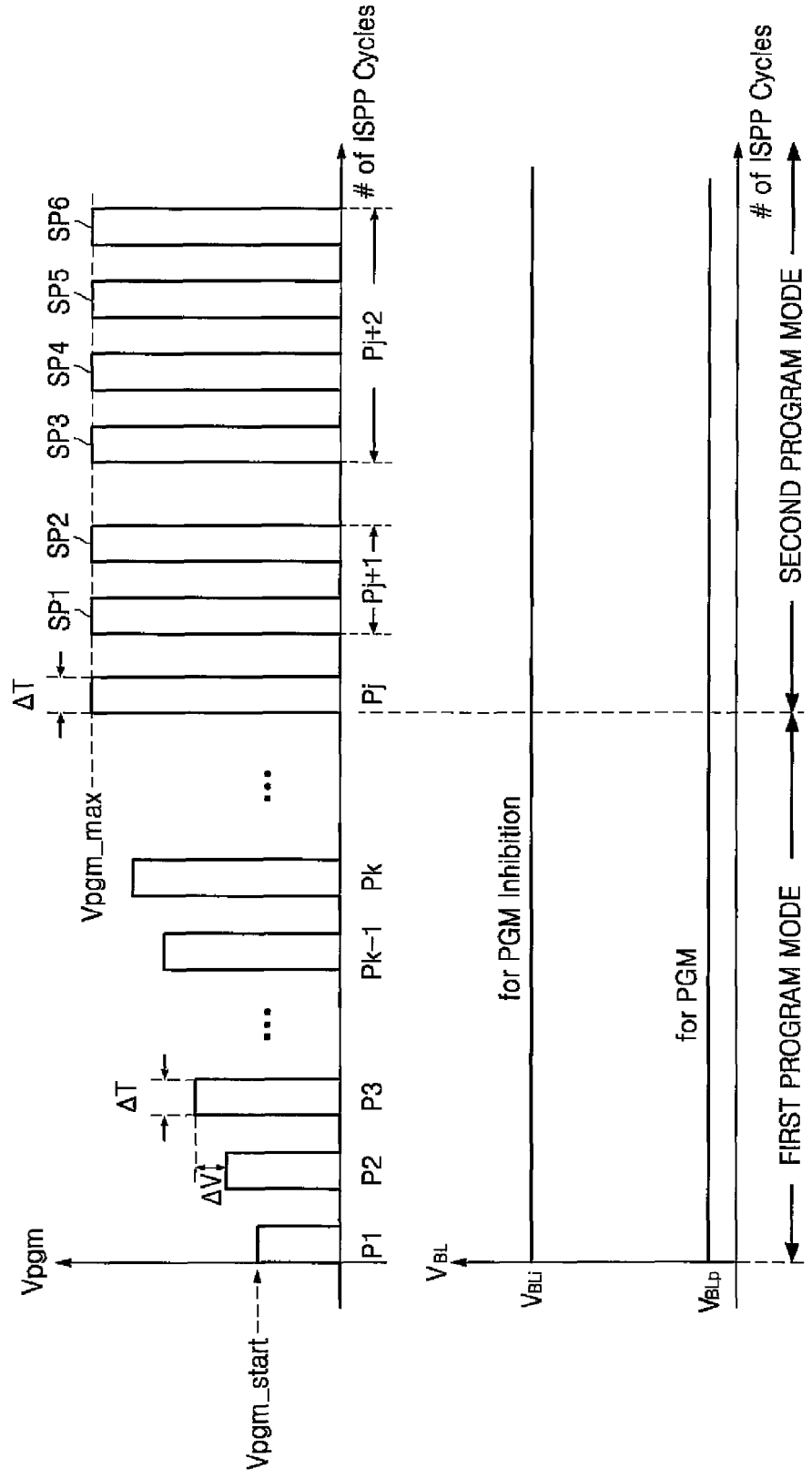
FIG. 6 is a diagram showing a programming method according to other embodiments of the inventive concept.

FIG. 6 is a diagram showing a programming method according to other embodiments of the inventive concept. The programming method illustrated in FIG. 6 is similar to that illustrated in FIG. 5. Thus, only differences there between will be described to avoid redundancy.

In the programming method illustrated in FIG. 6, change in the effective width of a program pulse is accomplished by application of a plurality of sub pulses having a fixed predetermined width during the second program mode. Accordingly, the number of sub pulses applied in sequence can be used to define the "width" of the program pulse. For example, a pulse width of 20 μs may be achieved by application of two (2) sub pulses having a width of 10 μs, and a pulse width of 40 μs may be achieved by application of four (4) sub pulses having a width of 10 μs. Of further note, a verify pulse is not applied between the sub pulses used to realize a pulse width of variable duration.

Referring to FIG. 6, for the first program pulse Pj in the second program mode, the program voltage Vpgm is set to the maximum value Vpgm_max and a pulse width ΔT is set to 10 μs. For the second program pulse Pj+1, the program voltage Vpgm is set to the maximum value Vpgm_max and the pulse width ΔT is set to consist of two (2) sub pulses SP1 and SP2 of 10 μs. For the third program pulse Pj+2, the program voltage Vpgm is set to the maximum value Vpgm_max and the pulse width ΔT is set to consist of four (4) sub pulses SP3, SP4, SP5, and SP6 of 10 μs.

When the width of a program pulse is changed using a different number of sub pulses having a predetermined width instead of directly increasing the width of the program pulse, the effective pulse width may be increased and channel leakage current that may occur due to the increase of the pulse width may be prevented.

Figure 7:
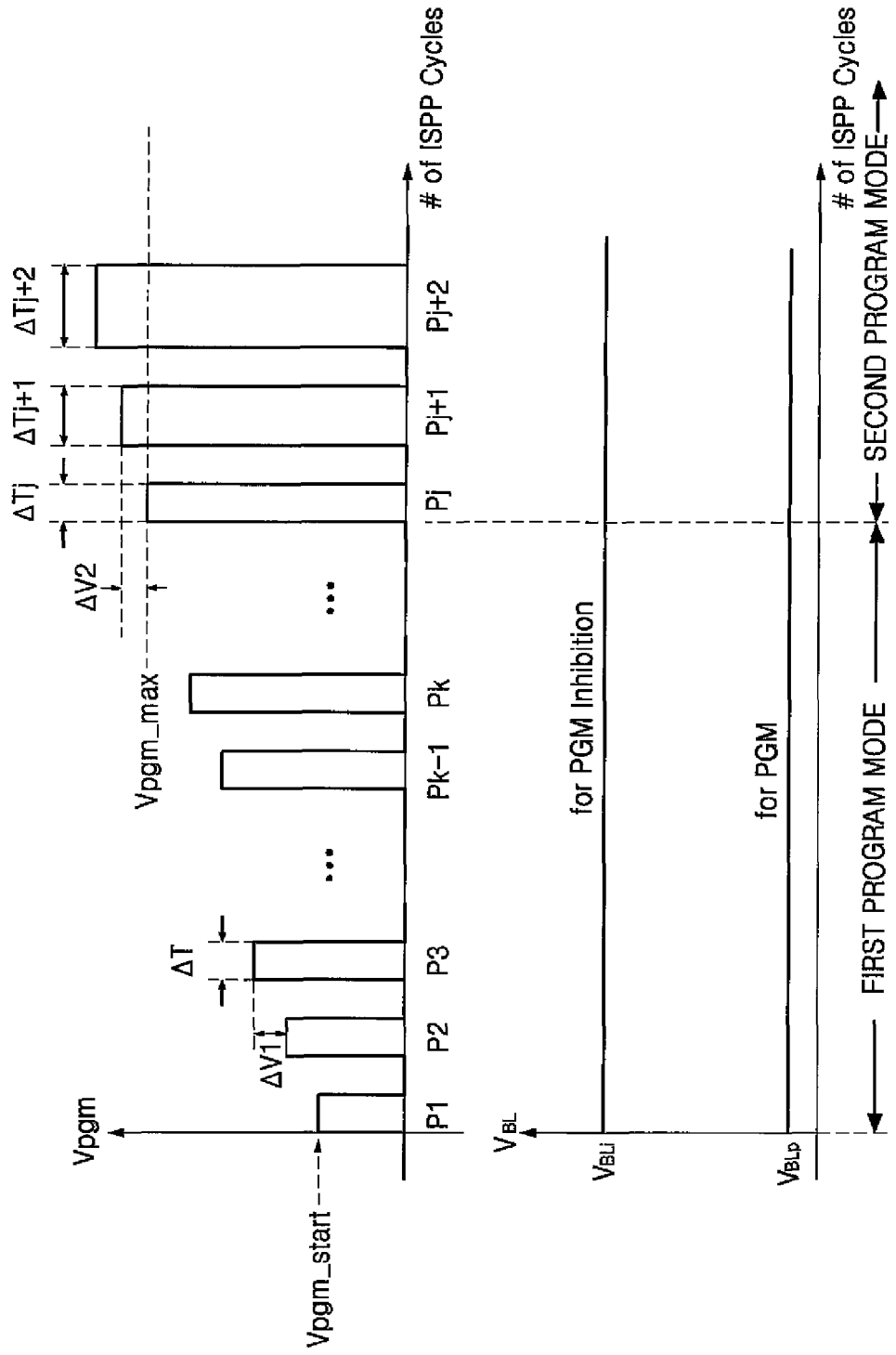
FIG. 7 is a diagram showing a programming method according to further embodiments of the inventive concept.

FIG. 7 is a diagram showing a programming method according to yet another embodiment of the inventive concept. Here again, the programming method illustrated in FIG. 7 includes a first program mode and a second program mode.

During the first program mode, the program pulse width ΔT is maintained constant and the program voltage Vpgm is increased from the program start voltage Vpgm_start by a first step voltage ΔV1, so that programming is accomplished using essentially a conventional ISPP scheme. When the increased program voltage Vpgm reaches a predetermined maximum value Vpgm_max or when the verification result count value satisfies a predetermined condition, the second program mode is started.

During the second program mode, both of the program pulse width ΔT and the program voltage Vpgm are increased. In certain embodiments of the inventive concept, the level increment of the program voltage Vpgm, (i.e., a second step voltage ΔV2) may be less than the first step voltage ΔV1. For example, the first step voltage ΔV1 may be set to 0.2 V and the second step voltage ΔV2 may be set to 0.1 V. Additionally, the program pulse width ΔT may be increased using either one of the approaches previously described (e.g., successive program pulse widths ΔTj, ΔTj+1, and ΔTj+2 may be increased by 10 μs during the second program mode). Although not shown in FIG. 7, a verify pulse may be applied between program pulses.

Alternatively, the change in the program pulse width ΔT may be manifested in a different number of sub pulses having a predetermined width. For instance, a program pulse width of 20 μs may be manifested in two sub pulses having a width of 10 μs and a program pulse width of 30 μs may be manifested in three sub pulses having a width of 10 μs. Here, however, a verify pulse is not applied between sub pulses.

During the first and second program modes, the bit line program voltage $V_{BLp}$ (e.g., 0 V) is applied to a bit line connected to a program cell and the bit line program inhibition voltage $V_{BLi}$ (e.g., 2.5 V) is applied to a bit line connected to a program-inhibited cell.

Alternatively expressed, the low-state programming is performed in the first program mode and high-state programming is performed in the second program mode. That is, during the overall ISPP scheme the program voltage Vpgm of a program pulse is increased by the first step voltage ΔV1 and the program pulse width ΔT is maintained constant for the low-state programming; and the program voltage Vpgm of the program pulse is increased by the second step voltage ΔV2 and the program pulse width ΔT is increased for the high-state programming. That is, the low-state programming may be performed using essentially the conventional ISPP scheme and the high-state programming may be performed using a programming method according to an embodiment of the inventive concept.

Figure 8A:
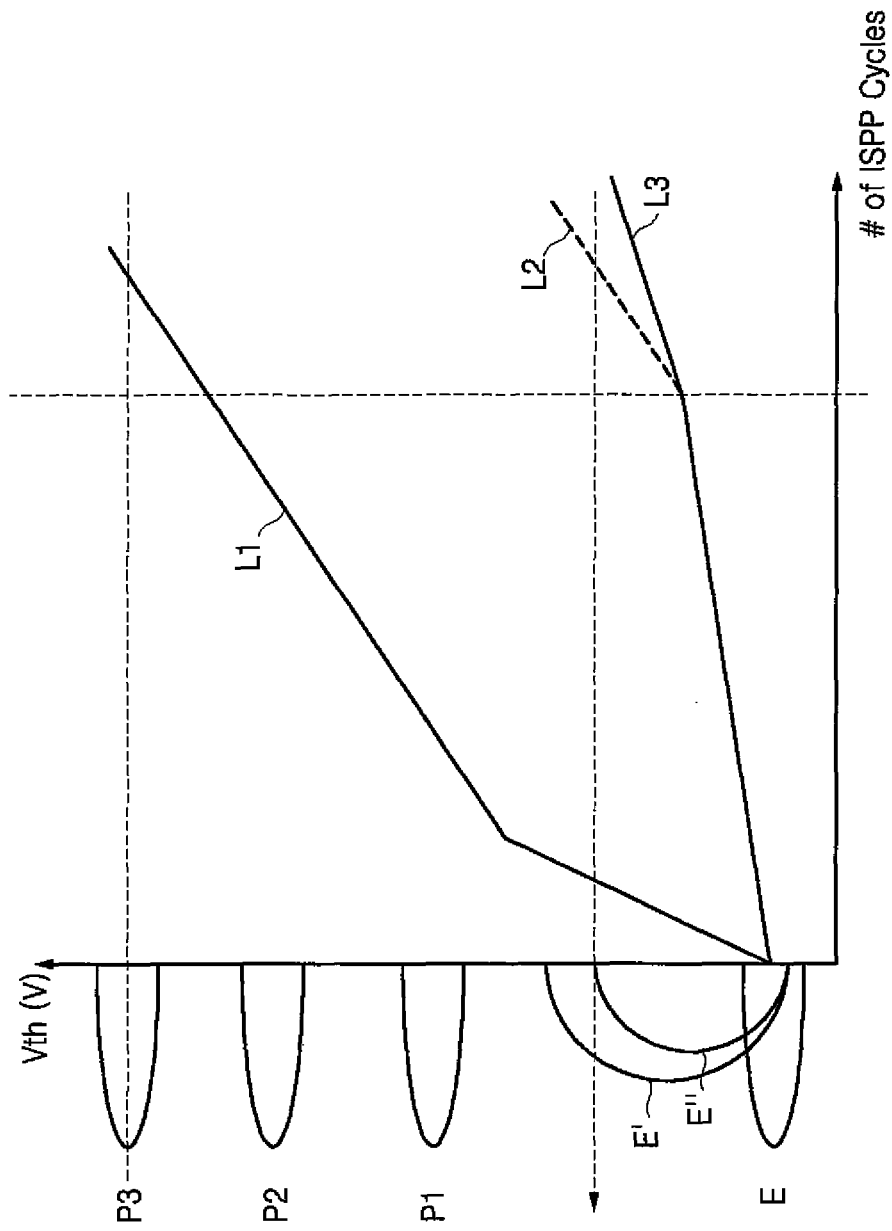
FIGS. 8A through 8C are diagrams showing a comparison between a program method according to certain embodiments of the inventive concept and a conventional ISPP scheme.
Figure 8B:
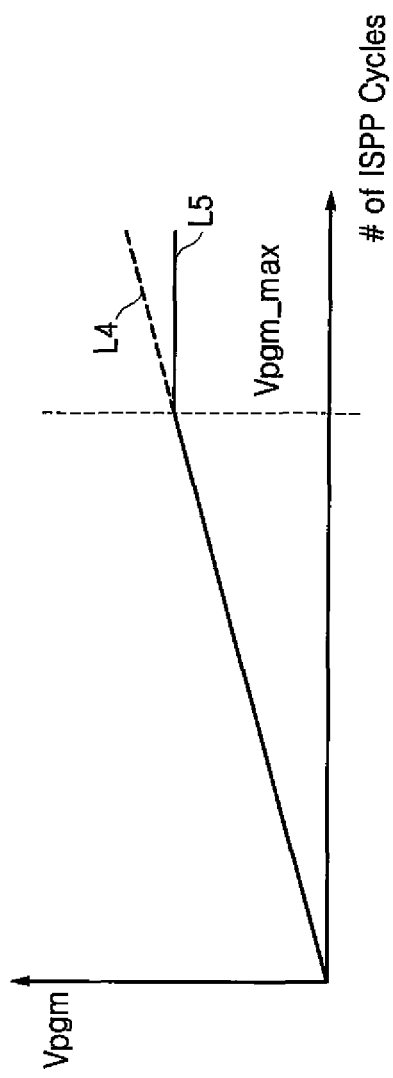
Figure 8C:
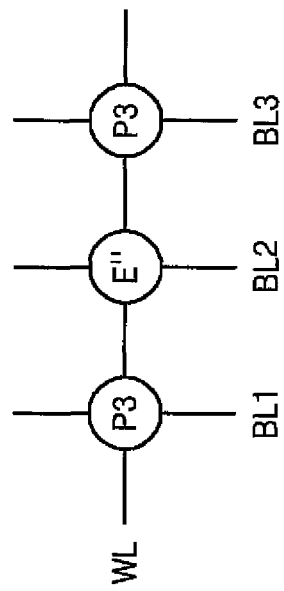

FIGS. 8A through 8C are diagrams conceptually illustrating a comparison of program disturb between a program method (hereinafter, referred to as "proposed method") according to some embodiments of the present inventive concept and a conventional ISPP scheme. Referring to FIGS. 8A through 8C, the graph line L1 shows a threshold voltage of a program cell in both of the conventional ISPP scheme and the proposed method. The graphs L2 and L3 show a threshold voltage of a disturbed cell, i.e., an erased cell in the conventional ISPP scheme and in the proposed method, respectively. Referring to FIGS. 8A through 8C, when the program voltage Vpgm is less than a predetermined level, e.g., the maximum value Vpgm_max, there is nearly no difference in the threshold voltage of a disturbed cell between the conventional ISPP scheme and the proposed method. However, when the program voltage Vpgm reaches the predetermined level, i.e., Vpgm_max, while the program voltage Vpgm is maintained constant in the proposed method as shown in the graph line L5 of FIG. 8B, it is continuously increased in the conventional ISPP scheme as shown in the graph line L4 in FIG. 8B, and therefore, the threshold voltage of a disturbed cell E'' in the proposed method is lower than that of a disturbed cell E' in the conventional ISPP scheme. Accordingly, it is concluded that a disturbed cell is less affected by program disturb in the proposed method than in the conventional ISPP scheme. Consequently, an ISPP scheme designed according to certain embodiments of the inventive concept reduce program disturb as compared to conventional ISPP schemes.

Figure 9:
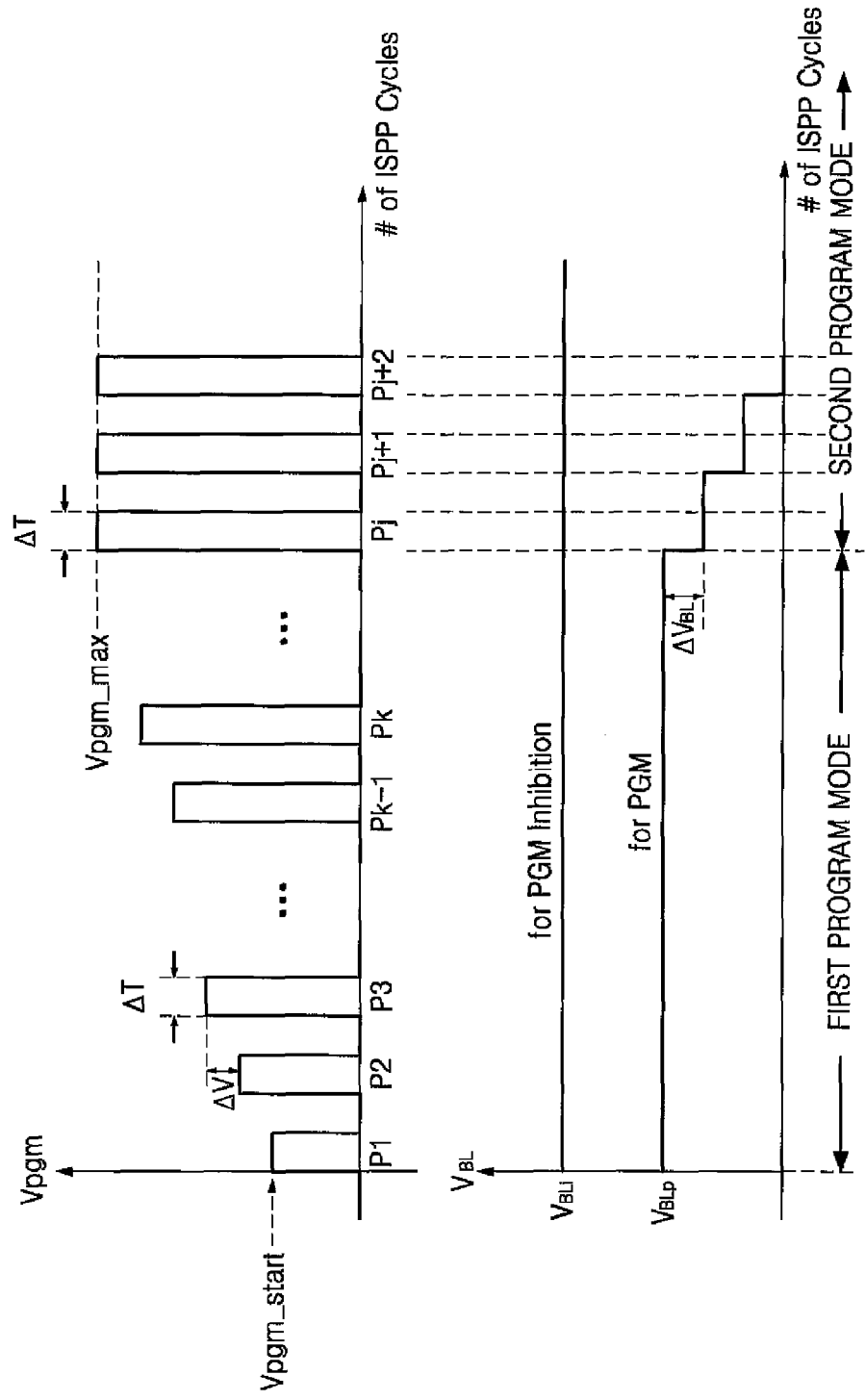
FIG. 9 is a diagram showing a programming method according to other embodiments of the inventive concept.

FIG. 9 is a diagram further illustrating a programming method according to another embodiment of the inventive concept. As before, the programming method illustrated in FIG. 9 includes a first program mode and a second program mode.

The first program mode in the embodiment of FIG. 9 is similar to the embodiment described in relation to FIG. 5. During the first program mode, the pulse width ΔT of the program voltage Vpgm in the ISPP scheme, i.e., the program voltage application time ΔT is maintained constant and the program voltage Vpgm is increased by the step voltage ΔV. When the increased program voltage Vpgm reaches a predetermined maximum value Vpgm_max or when the verification result count value satisfies a predetermined condition, the second program mode starts. In the first program mode, the bit line program voltage $V_{BLp}$ (e.g., 1.5 V) is applied to a bit line connected to a program cell and the bit line program inhibition voltage $V_{BLi}$ (e.g., 2.5 V) is applied to a bit line connected to a program-inhibited cell.

In the second program mode, the program voltage Vpgm is maintained at the maximum value Vpgm_max and the pulse width ΔT is also maintained constant. The bit line program inhibition voltage $V_{BLi}$ is maintained, but the bit line program voltage $V_{BLp}$ is decreased by a step bit line voltage $\Delta V_{BL}$ in the second program mode. For instance, for the first program pulse Pj in the second program mode, the bit line program voltage $V_{BLp}$ is set to a voltage obtained by subtracting the step bit line voltage $\Delta V_{BL}$ from the bit line program voltage $V_{BLp}$ of the first program mode. For the second program pulse Pj+1 in the second program mode, the bit line program voltage $V_{BLp}$ is set to a voltage obtained by subtracting the step bit line voltage $\Delta V_{BL}$ from the bit line program voltage $V_{BLp}$ of the first program pulse Pj.

When the bit line program voltage $V_{BLp}$ is decreased in steps while the program voltage Vpgm is maintained at the maximum value Vpgm_max in the second program mode, an effective voltage difference between a word line and a bit line, which are connected to a program cell, is increased in steps. Accordingly, during the second program mode, although the program voltage Vpgm is fixed, the effect of an increasing program voltage Vpgm may be achieved over successive ISPP cycles.

The above-described embodiments of the inventive concept may be used to program a multi-level memory cells (MLC) capable of storing two or more data bits, as well as a single-level cell (SLC) capable of storing only a single bit. The MLC has at least three storage states (or cell states) and at least three threshold voltage distributions respectively corresponding to the at least three cell states, as illustrated in FIG. 2.

When a memory cell stores 2-bit data, the memory cell may be in one state among four cell states, i.e., the erased state E, the first programmed state P1, the second programmed state P2, and the third programmed state P3, as illustrated in FIG. 2. Programs for making the memory cell being in the first through third program states P1 through P3 are referred to as a P1 program, a P2 program, and a P3 program, respectively. The P1 through P3 programs may be performed in parallel.

The P1 through P3 programs may be performed in both of first and second program modes. Alternatively, a different program mode may be used depending on a program state. For instance, the P1 and P2 programs may be performed in the first program mode and the P3 program may be performed in the second program mode in some embodiments of the present inventive concept. In other embodiments of the inventive concept, the P1 and P2 programs may be performed using the conventional ISPP scheme and the P3 program may be performed using a programming method according to some embodiments of the present inventive concept.

Figure 10:
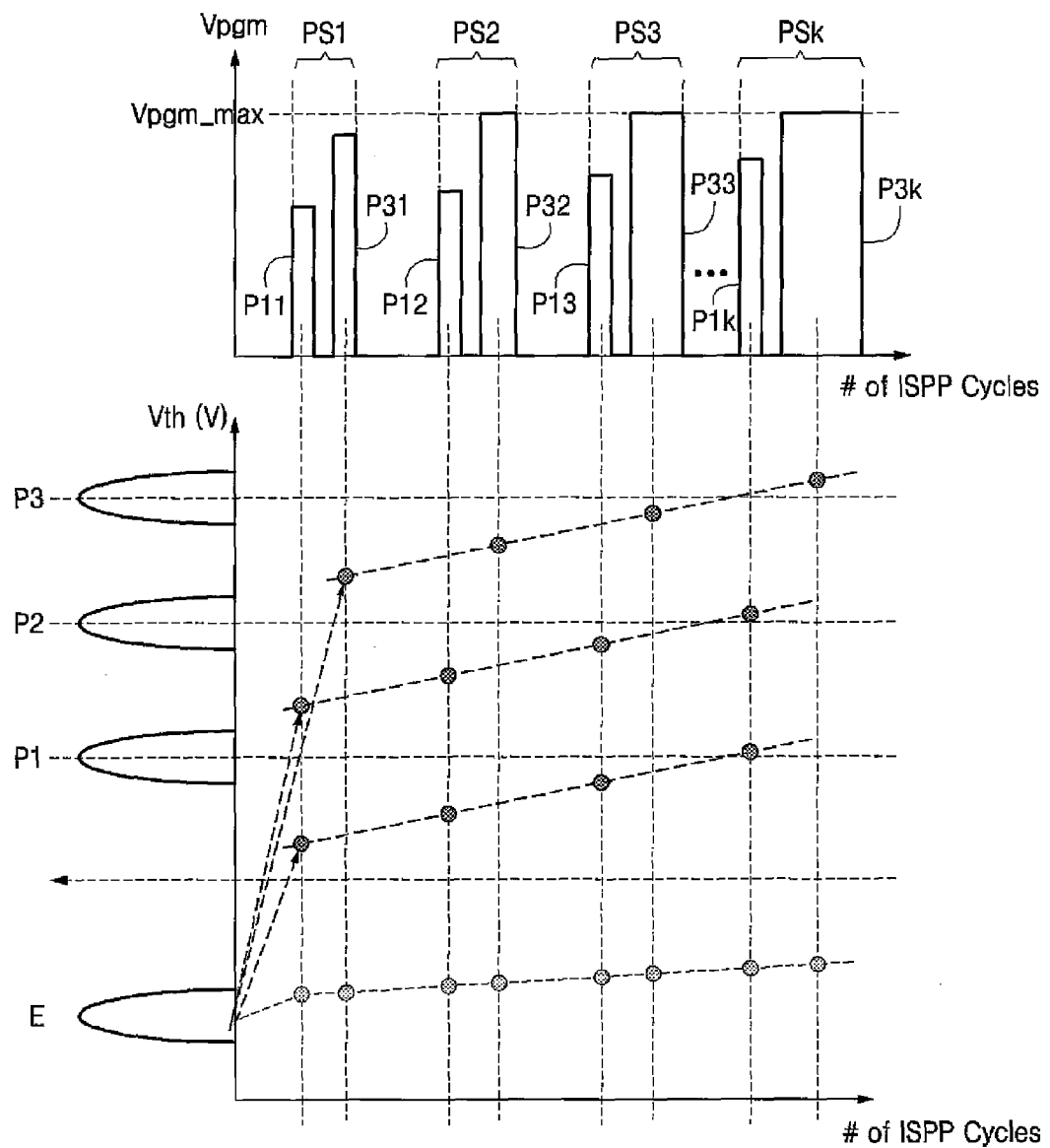
FIG. 10 is a diagram showing a programming method according to yet other embodiments of the inventive concept.

FIG. 10 is a diagram showing a programming method according to yet another embodiment of the inventive concept. The programming method illustrated in FIG. 10 is similar to that illustrated in FIG. 5. Thus, differences therebetween will be described to avoid redundancy. The programming method illustrated in FIG. 10 includes low-state programming and high-state programming.

The low-state programming is performed with respect to a memory cell to be programmed to the low state P1 or P2. The low-state programming may be performed in a first program mode according to some embodiments of the present inventive concept. For instance, with respect to a memory cell to be programmed to the low state P1 or P2, a series of low-state program pulses P11, P12, P13, ..., P1k for which the pulse width ΔT is maintained constant and the program voltage Vpgm is increased by the step voltage ΔV as in the first program mode described with reference to FIG. 5 are generated, so that the program and verify operations are alternately and repeatedly performed.

With respect to a memory cell to be programmed to the high state P3, the high-state programming is performed. The high-state programming may be performed in a second program mode according to some embodiments of the present inventive concept or may be performed in both of the first and second program modes. For instance, for a memory cell to be programmed to the high state P3, a series of high-state program pulses P31, P32, P33, ..., P3k for which a pulse width is increased according to a predetermined rule and the program voltage Vpgm is increased and then maintained constant at the maximum value Vpgm_max are generated, so that the program and verify operations are alternately and repeatedly performed.

Alternatively, in the low-state programming, a series of the low-state program pulses P11, P12, P13, ..., P1k for which the pulse width ΔT is maintained constant and the program voltage Vpgm is increased by the first step voltage ΔV1 as in the first program mode described with reference to FIG. 7 are generated, so that the program and verify operations are alternately and repeatedly performed. In the high-state programming, a series of the high-state program pulses P31, P32, P33, ..., P3k for which the pulse widths, e.g., ΔTj, ΔTj+1, and ΔTj+2, are increased according to a predetermined rule and the program voltage Vpgm is increased by the second step voltage ΔV2 as in the second program mode described with reference to FIG. 7 are generated, so that the program and verify operations are alternately and repeatedly performed.

The low-state programming and the high-state programming are performed in parallel. In detail, a program pulse set PS1, PS2, PS3, ..., PSk including a low-state program pulse and a high-state program pulse is applied between two adjacent verify pulses (not shown). For instance, after a first programming cycle in which the first program pulse set PS1 including the first low-state program pulse P11 and the first high-state program pulse P31 is applied, a verify pulse (not shown) is applied to perform program verification. Next, after a second programming cycle in which the second program pulse set PS2 including the second low-state program pulse P12 and the second high-state program pulse P32 is applied, another verify pulse (not shown) is applied to perform the program verification.

At this time, the low-state program pulses P11 through P1k are applied to only memory cells to be programmed to the low state P1 or P2 and the high-state program pulses P31 through P3k are applied to only memory cells to be programmed to the high state P3. In other words, while the low-state program pulses P11 through P1k are applied, memory cells to be programmed to the high state P3 are inhibited from being programmed.

Figure 11:
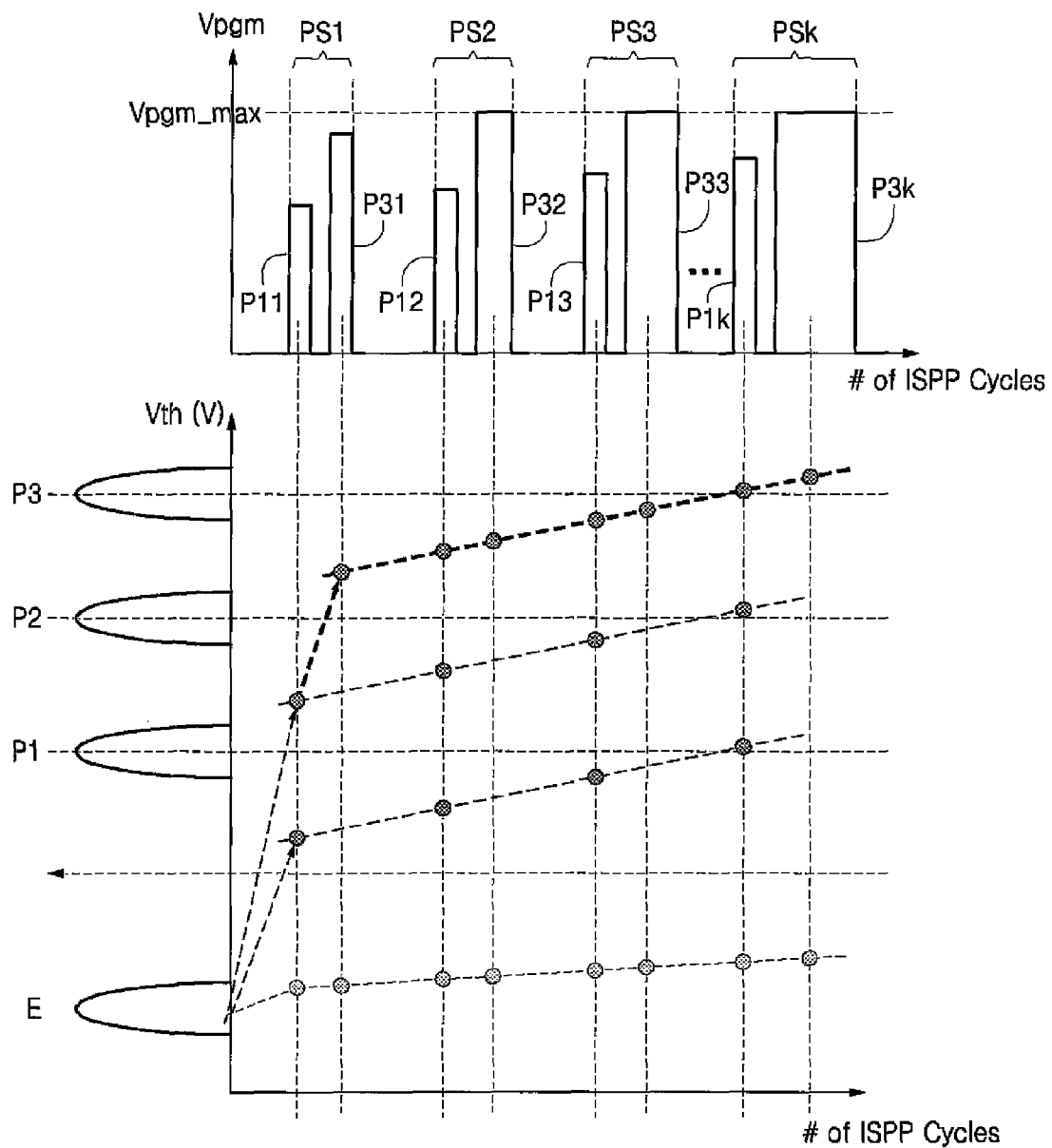
FIG. 11 is a diagram showing a programming method according to still other embodiments of the inventive concept.

FIG. 11 is a diagram showing a programming method according to still another embodiment of the inventive concept. The programming method illustrated in FIG. 11 is similar to that illustrated in FIG. 10. Thus, differences therebetween will be described to avoid redundancy.

Referring to FIG. 11, the low-state program pulses P11 through P1k are applied to both of memory cells to be programmed to the low state P1 or P2 and memory cells to be programmed to the high state P3 and the high-state program pulses P31 through P3k are applied to only memory cells to be programmed to the high state P3.

In the embodiments illustrated in FIGS. 10 and 11, the width of a program pulse may be changed using different numbers of sub pulses having a predetermined width, as in the embodiments illustrated in FIG. 6.

In the embodiments illustrated in FIGS. 10 and 11, the predetermined bit line program inhibition voltage $V_{BLi}$ (e.g., 2.5 V) is applied to a bit line connected to a program-inhibited cell while the predetermined bit line program voltage $V_{BLp}$ (e.g., 1.5 V) is applied to a bit line connected to a program cell during the low-state programming; and the bit line program voltage $V_{BLp}$ decreasing in steps at each programming cycle is applied to a bit line connected to a program cell while the predetermined bit line program inhibition voltage $V_{BLi}$ (e.g., 2.5 V) is applied to a bit line connected to a program-inhibited cell during the high-state programming, as in the embodiments illustrated in FIG. 9.

Figure 12:
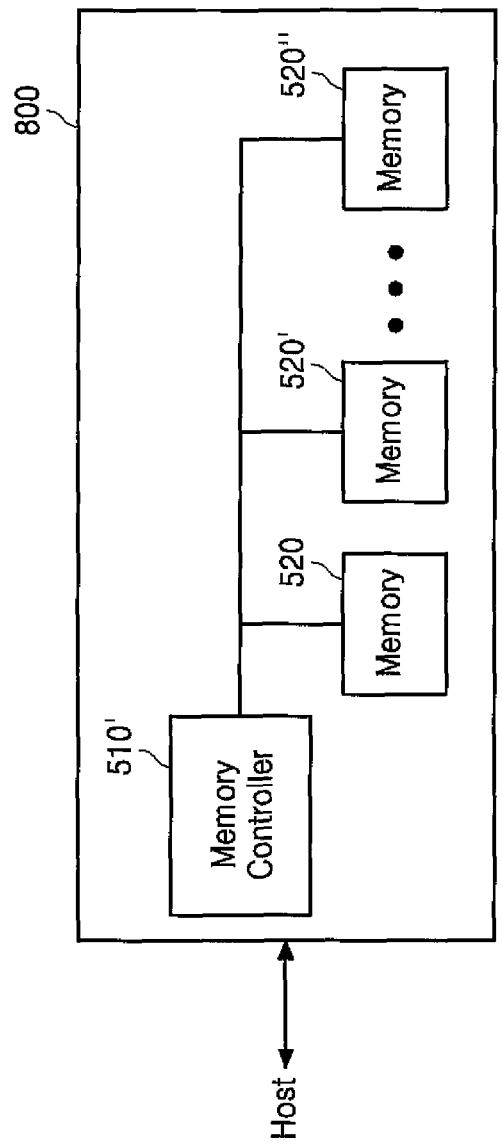
FIG. 12 is a schematic block diagram of a non-volatile memory system according to an embodiment of the inventive concept.

FIG. 12 is a schematic block diagram of a non-volatile memory system 800 according to an embodiment of the inventive concept. The non-volatile memory system 800 comprises a plurality of the non-volatile memory devices 520, 520', and 520" and a memory controller 510 controlling the non-volatile memory devices 520 through 520". Each of the non-volatile memory devices 520, 520', and 520" may be the non-volatile memory device 10 illustrated in FIG. 4. Detailed descriptions about configurations and operations of the non-volatile memory devices 520, 520', and 520" will be thus omitted.

The non-volatile memory device 520, 520', and 520" and/or the memory controller 510 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The memory device 520, 520', and 520" and the memory controller 510 may form a memory card. At this time, the memory controller 510 may be designed to communicate with an external device, e.g., a host, using one of various interface protocols such as universal serial bus (USB), multimedia card (MMC), a peripheral component interconnect express (PCI-E), serial ATA (SATA), parallel ATA (PATA), small computer system interface (SCSI), enhanced small disk interface (ESDI), and integrated drive electronics (IDE).

With the increase of use of mobile devices such as cellular phones, personal digital assistants (PDA), digital cameras, portable game consoles, and MP3 players, the memory devices 10, 520, 520', and 520" can be used as code storages as well as data storages. The memory devices 10, 520, 520', and 520" can also be used in home applications such as high definition televisions (HDTVs), DVDs, routers, and global positioning systems (GPSs).

The non-volatile memory device or the memory system according to an embodiment of the inventive concept may be embedded in the electronic system such as mobile devices, laptop computers, or desktop computers. Some examples of the electronic system are illustrated in FIGS. 13 and 14.

Figure 13:
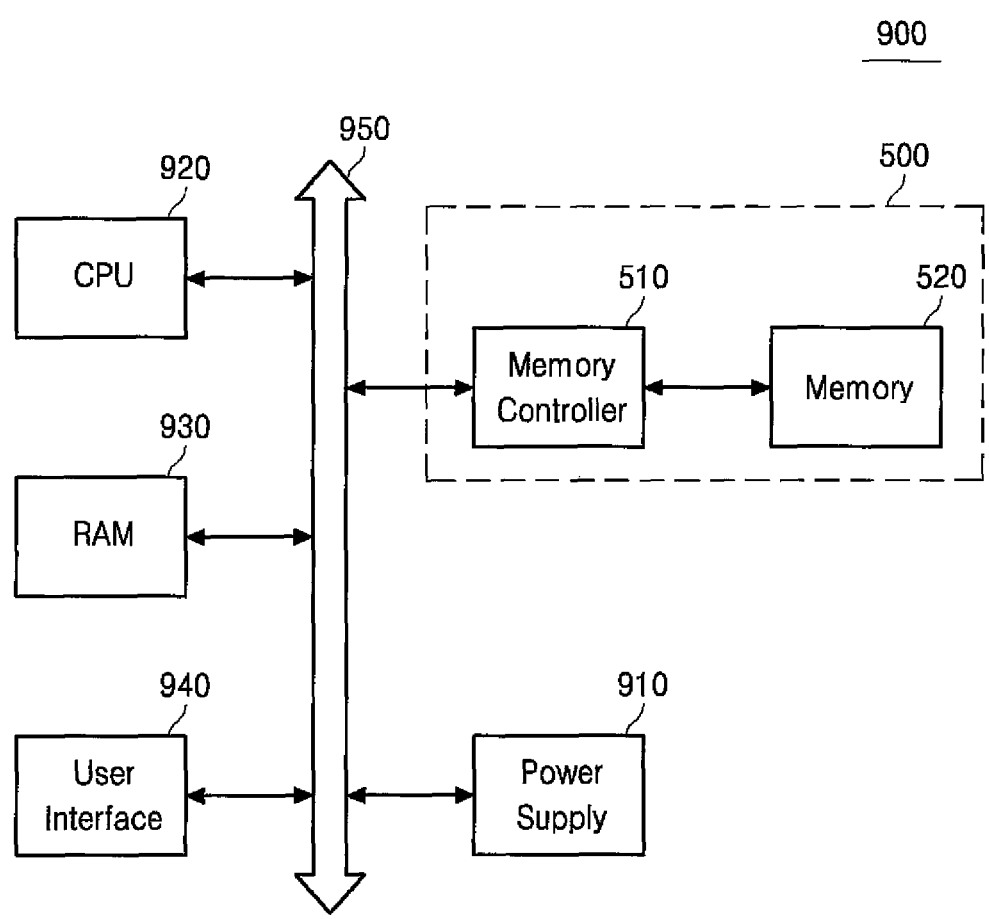
FIG. 13 is a block diagram of an electronic system according to an embodiment of the inventive concept.
Figure 14:
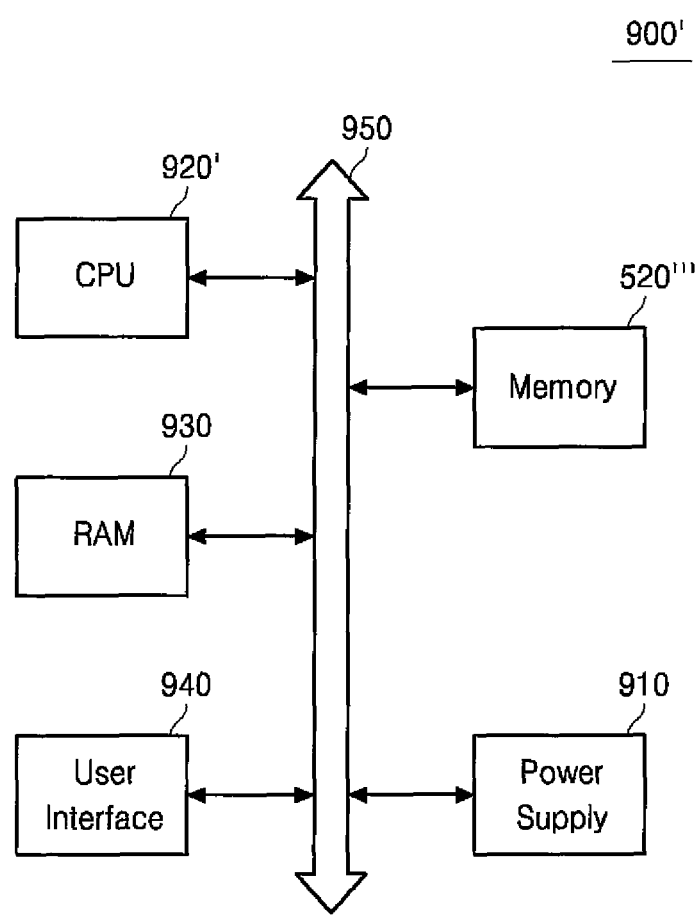
FIG. 14 is a block diagram of an electronic system according to another embodiment of the inventive concept.

Referring to FIG. 13, the electronic system 900 comprises a nonvolatile memory system 500, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the nonvolatile memory system 500.

The flash memory 520 stores the N-bit data, where N is 1 or an integer greater than 1, that is provided through the user interface 940 or processed or will be processed by the CPU 920, via the memory controller 510.

The memory system 500 according to an embodiment of the inventive concept is as described above. A detailed description thereof will be thus omitted.

Although the memory device 520 and the memory controller 510 may together constitute a single memory card, the memory device 520 and the memory controller 510 may be separately embodied. The memory controller and the flash memory may constitute, for example, a solid state drive/disk (SSD) using a non-volatile memory for storing data. The memory controller 510 may be embodied in a host.

FIG. 14 illustrates an electronic system 900' according to another embodiment of the inventive concept. Electronic system 900' comprises a nonvolatile memory device 520''' functioning as a main memory. The CPU 920' controls the overall operation of the electronic system 900' and functions as memory controller. For example, the CPU 920' may receive and process data input via the user interface 940 and then transmit the data to the nonvolatile memory device 520''' via the system bus 950. The nonvolatile memory device 520''' may store the data input via the system bus 950 into memory cells. The data stored in memory cells are read by the CPU 920' and output via the user interface 940.

Although the nonvolatile memory device 520''' has similar construction and function as the nonvolatile memory device 10 illustrated in FIG. 4, the nonvolatile memory device 520''' does not interface with the host via a memory controller but directly interfaces with the host. The electronic system 900' illustrated in FIG. 14 may be a portable electronic system such as a mobile device.

Although it is not illustrated in the drawings, the electronic system 900 or 900' may be further provided with application chipsets, camera image processors (CISs), or mobile DRAMs, which is well known to one skilled in the art to which the present inventive concept pertains.

The non-volatile memory operation method according to certain embodiments of the inventive concept can also be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may include read-only memory (ROM), random-access memory (RAM), electrically erasable programmable ROM (EEPROM), and flash memory.

As described above, according to certain embodiments of the inventive concept, program disturb is reduced as compared to the conventional ISPP scheme. In particular, program disturb occurring during high-state programming is reduced. As a result, disturb errors are decreased and data reliability is increased.

While the inventive concept has been particularly shown and described with reference to embodiments thereof, it will be understood by those of ordinary skill in the art that various changes in forms and details may be made therein without departing from the scope of the inventive concept as defined by the following claims.

What is claimed is:

1. A method of programming a non-volatile memory device including a plurality of non-volatile memory cells using an incremental step pulse programming (ISPP) scheme, the method comprising:
    operating in a first program mode during which a program pulse width is constant and a program voltage is successively increased by a first step voltage per ISPP cycle, and during which a program operation and a verify operation are alternately repeated; and
    operating in a second program mode during which the program pulse width is successively increased per ISPP cycle and the program voltage is increased by a second step voltage, and during which a program operation and a verify operation are alternately repeated,
    wherein operation in the second program mode follows operation in the first program mode only when the program voltage equals a maximum value, or a verification result count value satisfies a predetermined condition.

2. The method of claim 1, wherein the second step voltage is less than the first step voltage.

3. The method of claim 1, wherein the predetermined condition is a number of pass cells or a number of fail cells determined during the verify operation.

4. The method of claim 1, wherein the plurality of non-volatile memory cells are multi-level cell (MLC) memory cells.

5. The method of claim 1, wherein during the second program mode, the program pulse is successively increased per ISPP cycle by applying an increasing number of sub pulses having a constant sub pulse width per ISPP cycle.

6. The method of claim 1, wherein a bit line program inhibition voltage applied to a bit line connected to a program-inhibited cell and a bit line program voltage applied to a bit line connected to a program cell are constant in the first program mode; and
    the bit line program inhibition voltage applied to the bit line connected to the program-inhibited cell is constant and the bit line program voltage applied to the bit line connected to the program cell successively decreases per ISPP cycle in the second program mode.

* * * * *